United States Patent [19]
Kimoto et al.

[11] Patent Number: 5,144,380
[45] Date of Patent: Sep. 1, 1992

[54] DIAMOND SEMICONDUCTOR DEVICE WITH A NON-DOPED DIAMOND THIN FILM BETWEEN A DIAMOND ACTIVE LAYER AND A SUBSTRATE

[75] Inventors: Tunenobu Kimoto; Tadashi Tomikawa; Nobuhiko Fujita, all of Hyogo, Japan

[73] Assignee: Sumitomo Electric Industries, Ltd., Osaka, Japan

[21] Appl. No.: 592,794

[22] Filed: Oct. 4, 1990

[30] Foreign Application Priority Data

Oct. 4, 1989 [JP] Japan .................. 1-259256

[51] Int. Cl.$^5$ ............................... H01L 29/80
[52] U.S. Cl. ............................. 357/22; 357/13; 357/16; 357/15; 357/28
[58] Field of Search ............. 357/22 I, 22, 22 M, 357/16, 13, 28, 15; 437/100, 103

[56] References Cited

U.S. PATENT DOCUMENTS

| 4,863,529 | 9/1989 | Imai et al. | 437/103 |
| 4,929,986 | 5/1990 | Yoder | 357/22 M |
| 4,947,220 | 8/1990 | Yoder | 357/16 |
| 4,981,818 | 1/1991 | Anthony et al. | 437/103 |
| 4,982,243 | 1/1991 | Nakahata et al. | 357/22 |

FOREIGN PATENT DOCUMENTS

| 0262601 | 4/1988 | European Pat. Off. | 357/28 |
| 59-63732 | 4/1984 | Japan | 357/22 I |
| 1-62911 | 3/1989 | Japan | 357/22 I |
| 1-161759 | 6/1989 | Japan | 357/22 I |
| 1-246867 | 10/1989 | Japan | 357/22 I |
| 1-308900 | 12/1989 | Japan | 357/22 I |
| 1-317197 | 12/1989 | Japan | 357/22 I |

OTHER PUBLICATIONS

A. T. Collins, "Daimond electronic devices-a critical appraisal", Semiconductor Science and Tech., Aug. (1989), pp. 605–611.

*Primary Examiner*—Rolf Hille
*Assistant Examiner*—Steven Loke
*Attorney, Agent, or Firm*—Cushman, Darby & Cushman

[57] ABSTRACT

A semiconductor device utilizing a nondoped diamond layer between a substrate and an active diamond layer. Such a structure decreases the resistivity and increases the carrier density. Further, when contacts are formed on the active layer, this layer structure reduces reverse leak current.

7 Claims, 1 Drawing Sheet

DIAMOND SEMICONDUCTOR DEVICE WITH A NON-DOPED DIAMOND THIN FILM BETWEEN A DIAMOND ACTIVE LAYER AND A SUBSTRATE

BACKGROUND OF THE INVENTION

1. Field of the Invention

The present relates to a semiconductor device, such as thermistors, diodes and transistors comprising a diamond thin film.

2. Description of the Prior Art

Diamonds can be made into p-type semiconductors, and since they have advantages such as wide band gap, high carrier mobility, and excellent heat and environmental resistances, their use with semiconductor devices has become increasingly popular.

There are two types of diamond thin film semiconductors:

(1) a device comprising a single crystal diamond substrate having thereon a diamond thin film as the active layer, i.e., a device comprising a homoepitaxially grown active layer of diamond, and (2) a device comprising a thin film diamond active layer formed on a substrate made of a different material such as Si.

Examples of the homoepitaxially formed diamond device set forth in (1) above include experimentally fabricated Schottky diodes or MESFET's comprising a Schottky junction between a p-type diamond layer epitaxially grown on a single crystal diamond and a tungsten (W) or aluminum (Al) layer. Since an n-type diamond is not yet available, a Schottky junction between a p-type diamond and a metal is presently used.

Examples of the diamond devices found within group (2) above include experimental devices such as thermistors comprising polycrystalline diamond grown on a Si substrate and thin film electroluminescent (EL) devices comprising a polycrystalline diamond layer as the light-emitting layer. Present technology allows single crystal diamond thin films to grow only single crystal diamond substrates. In cases where Si or another metal is used as the substrate, only thin films of polycrystalline diamond are available. Thus, devices categorized as (2) are, without exception, based on polycrystalline diamonds.

In both cases above, however, the prior art technology used direct formation of the active diamond thin film on a substrate, using deposition methods such as microwave plasma CVD (chemical vapor deposition), RF (radio frequency) plasma CVD, ECR (electron cyclotron resonance) plasma CVD, and the like.

The prior art devices described above suffer from the following disadvantages:

(1) poor interface characteristics resulting in devices that provide insufficient characteristics with such characteristics probably being due to the formation of various interface states; and (2) poor film quality of the active layer formed at the initial stage of deposition, that is the active layer in contact with the substrate is so inferior that the resulting device is far from satisfactory. This is particularly problematic when a active layer as thin as 1 $\mu$m or less is required.

These deficiencies manifest themselves more readily when the diamond films are formed on a substrate other than diamonds.

SUMMARY OF THE INVENTION

The present invention provides a semiconductor device utilizing a diamond thin film as the active layer, where at first a non-doped diamond thin film is formed on a substrate, then a diamond active layer is formed on the non-doped diamond thin film.

That is, a non-doped (high resistance) diamond layer is incorporated between the substrate and the diamond thin film active layer thereby providing favorable interface characteristics and excellent properties over the whole area.

BRIEF DESCRIPTION OF THE DRAWING

Other objects, features and characteristics of the present invention, as well as methods of operation and functions of the related parts and elements of the structure, and to the combination of parts and economies of manufacture, will become apparent upon consideration of the following description and the appended claims with reference to the accompanying drawing, all of which form a part of this specification.

The figure is a cross-sectional view of the diamond semiconductor diode according to an embodiment of the present invention.

DETAILED DESCRIPTION OF THE PRESENTLY PREFERRED EXEMPLARY EMBODIMENTS

Figure 1:
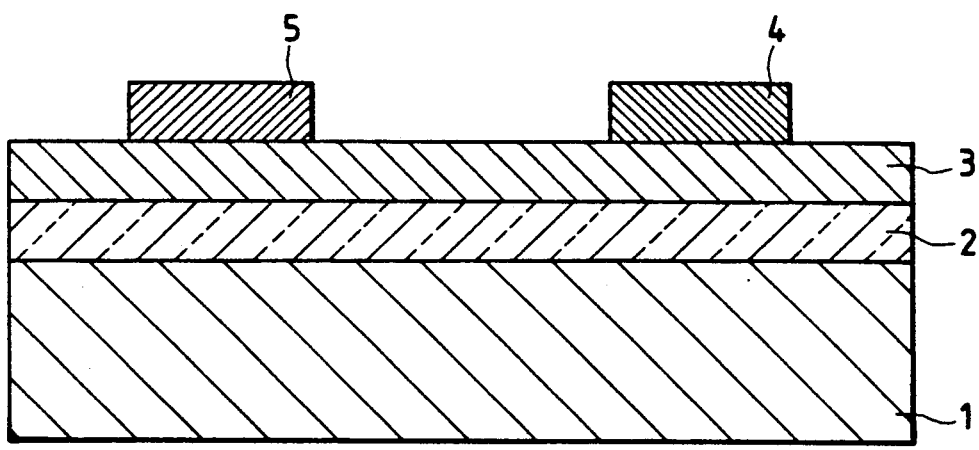

The present invention involves forming a non-doped diamond layer on a substrate and forming a diamond thin film as an active layer on the non-doped diamond layer. Such a process provides improved interface characteristics which can eventually reduce the interface state. This, in turn, increases the carrier mobility, reduces the resistance to thereby and improve the impurity-doping efficiency.

The substrates referred to herein include single crystal diamond substrates, Si substrates, and metal substrates. Non-doped diamonds may be grown either homoepitaxially or heteroepitaxially.

It is not fully understood how the non-doped layer functions to provide the abovementioned effects, but the possible mechanism is as follows.

In the case of depositing a diamond thin film on a diamond substrate a problem exists. The problem is that the diamond substrate is so hard and chemically stable, a proper method for surface pretreatment is not yet established. As a consequence, the diamond film is epitaxially grown on a non-treated diamond substrate which still comprises residual impurities or machine stress. Thus, the resulting junction is liable to generate a strong internal strain at the junction or to form multiple interface state.

In the case of depositing a diamond thin film on a substrate other than the single crystal diamond, such as an Si or metal substrate, a heterojunction results between the substrate and the diamond film. In this case, the mismatch in lattice parameters and crystal structures again leads to the formation of a large stress in the thin film. It is likely that the diamond thin film formed at the initial stage, in particular, will have a poor crystallinity.

As set forth above, it can be easily imagined that the crystallinity of the diamond thin film deposited on a substrate is deteriorated due to unfavorable interface conditions such as impurities adsorbed on the substrate and machine stress remaining on the surface of the substrate.

The process according to the present invention therefore incorporates a step of growing a non-doped diamond layer on the substrate prior to the deposition of a diamond active layer.

This additional diamond layer considerably reduces the influence of the surface impurities upon the active layer, as well as that of the machine stress also remaining on the surface of the substrate. The crystallinity of the active layer is thus improved.

The non-doped diamond layer is deposited so as to electrically insulate the active layer from the substrate, taking advantage of the resistivity, which is as high as, and may even exceed, $10^{14}$ $\Omega$.cm, of the non-doped diamond layer. This enables a semiconductor device to have considerable freedom in its structure.

The thickness of the non-doped diamond thin film to be incorporated as the interlayer depends on the substrate material and the type of the device, but the thickness is preferably 100 Å or more to maintain a favorable interface condition.

EXAMPLE 1 (RESISTIVITY)

A diamond film was deposited on each of a diamond substrate and a c-BN substrate by a known microwave-plasma CVD method, and the quality of the deposited films was evaluated.

The diamond substrate used was an $I_b$-type single crystal synthesized under high pressure, and an active diamond layer was deposited on the (100) plane of the substrate. This layer proved to be a single crystal. In accordance with the embodiment of the present invention, a non-doped diamond layer from 50 to 1000 Å in thickness was deposited prior to the deposition of the active layer. Also, a device without the non-doped layer was fabricated as a comparative sample.

The c-BN substrate used herein was a polycrystalline c-BN obtained by sintering a BN powder under high pressure. Accordingly, the diamond active layer deposited thereon was also polycrystalline. In accordance with the embodiment of the present invention, a non-doped diamond layer 500 Å in thickness was deposited prior to the deposition of the passive layer.

The non-doped layer was deposited using a gas mixture based on $H_2$ containing 1% $CH_4$ under a pressure of 40 Torr and at a microwave output power of 400 W, while maintaining the substrate temperature at 850° C. Then, a p-type B-doped diamond active layer was deposited thereon. The conditions of the passive layer was basically the same as that used in the deposition of the non-doped layer, except for the addition of $B_2H_6$ at the $B_2H_6/CH_4$ ratio of 50 ppm.

The thickness of the non-doped layer was varied, so as to obtain films 50, 100, 500 and 1000 Å each in thickness, while the active layer was maintained at a constant thickness of 1 μm.

TABLE 1

Resistivity, mobility, and carrier density of the fabricated devices

| | Substrate | Non-doped layer thickness | Resistivity $\Omega$cm | Mobility $cm^2/Vsec$ | Carrier Density $Cm^{-3}$ |
|---|---|---|---|---|---|
| Comp. Ex. | diamond | 0 | 82 | 145 | $5.3 \times 10^{14}$ |
| Ex. | diamond | 50 | 66 | 157 | $6.0 \times 10^{14}$ |
| Ex. | diamond | 100 | 21 | 208 | $1.4 \times 10^{15}$ |
| Ex. | diamond | 500 | 11 | 275 | $2.1 \times 10^{15}$ |
| Ex. | diamond | 1000 | 7.6 | 294 | $2.8 \times 10^{15}$ |

TABLE 1-continued

Resistivity, mobility, and carrier density of the fabricated devices

| | Substrate | Non-doped layer thickness | Resistivity $\Omega$cm | Mobility $cm^2/Vsec$ | Carrier Density $Cm^{-3}$ |
|---|---|---|---|---|---|
| Comp. Ex. | C-BN | 0 | 810 | 1.6 | $4.8 \times 10^{15}$ |
| Ex. | C-BN | 500 | 260 | 4.5 | $5.3 \times 10^{15}$ |

The measured resistivity, carrier concentration, and the carrier mobility of the devices are given in Table 1. It reads that the devices comprising non-doped diamond layers yield lower resistivity and higher carrier concentration at the same doped amounts. This illustrates that the devices according to the present invention have superior doping efficiency.

Furthermore, the carrier mobility is also improved. This may signify decreases in interface state.

The resistivity decreases and carrier concentration increases with increasing layer thickness of the non-doped layer. The effect is particularly distinguished with a non-doped layer 500 Å or more in thickness. The resistivity is decreased to a remarkable value of less than one-tenth of that with no non-doped layer when the thickness of the non-doped layer is 1000 Å.

The present invention compared with the comparative example was explained in detail above with reference to devices using diamond as the substrate. The same can be said of devices using c-BN as the substrate. The incorporation of a 500 Å thick non-doped layer reduces the resistivity to less than one-third of the value when no non-doped layer was formed.

EXAMPLE II (DIODE CHARACTERISTICS)

On the (100) plane of an $I_b$type synthesized single crystal diamond substrate, diamond thin film were formed in the same manner as in Example I. A contact was provided on the film to give a Schottky diode as schematically shown in the figure. The $I_b$-type diamond comprises substitutional nitrogen, and can be prepared by high pressure synthesis.

In FIG. 1, non-doped diamond thin film 2 was formed on the $I_b$-type diamond substrate 1, and further thereon B-doped diamond active layer 3 was formed. The Schottky contact electrode 4 on the active layer 3 was formed by sputtering either W or Al. The Ti ohmic contact electrode 5 on the active layer 3 was formed by vacuum evaporation.

The active layer was uniform in thickness, whereas the non-doped layer was varied in the range of from 0 to 1000 Å.

Between electrodes 4 and 5, applied a voltage to obtain the current-voltage (I-V) characteristics (diode characteristics), and the results are given in Table 2. The reverse leak current is defined as the current that applying a voltage of 20 V in the reverse direction.

TABLE 2

Reverse leak current of the diodes

| | Non-doped layer thickness ( ) | Reverse direction leak current (A) |
|---|---|---|
| Comparative Ex. | 0 | $27 \times 10^{-12}$ |
| Example | 50 | $19 \times 10^{-12}$ |
| Example | 100 | $8.2 \times 10^{-12}$ |
| Example | 500 | $5.1 \times 10^{-12}$ |
| Example | 1000 | $2.8 \times 10^{-12}$ |

Table 2 illustrates that the comparative devices comprising an active layer directly formed on the substrate provides a higher reverse leak current, whereas the device according to the present invention having a non-doped layer as the interlayer yields a considerably reduced reverse leak current. The effect is particularly pronounced with a non-doped layer of 100 Å or more in thickness.

The decrease in reverse-direction leak current in the devices according to the present invention is attributed to the increased crystallinity of the p-type layer which was achieved by incorporating a non-doped layer thereunder.

Each diode yields a quality factor (n value) in the range of from about 1.7 to 2.0, where the "quality factor" is the value n in the following equation $$I = I_0[exp(eV/nkT) - 1],$$

which describes the current-voltage characteristics of the device, which ideally is 1.

The diamond semiconductor device according to the present invention is characterized in that it comprises a non-doped layer incorporated between the substrate and the active layer. The device, therefore, has an active layer with improved crystallinity, and thus yields high doping efficiency as well as high carrier mobility. Furthermore, the diamond device according to the present invention is also improved in other semiconductor properties including diode characteristics that are of great industrial use.

While the present invention has been described in connection with what is presently considered to be the most practical and preferred embodiment, it is to be understood that the invention is not limited to the disclosed embodiment, but is intended to cover various modifications and equivalent arrangements included within the spirit and scope of the appended claims.

What is claimed is:

1. A semiconductor device comprising:
   a substrate;
   a non-doped diamond thin film formed directly on said substrate;
   a diamond active layer formed directly on the non-doped diamond thin film; and
   contacts formed directly on said diamond active layer;
   wherein said non-doped diamond thin film substantially reduces the influence of at least one of interface states and surface impurities upon the active layer, and wherein said non-doped diamond thin film insulates said active layer from said substrate.

2. A semiconductor device as claimed in claim 1, wherein said non-doped diamond thin film has a thickness of at least 100 Å.

3. A semiconductor device as claimed in claim 1, wherein said non-doped diamond thin film has a thickness in the range of from 50 Å to 1000 Å.

4. A semiconductor device as claimed in claim 1, wherein said substrate is a Si substrate.

5. A semiconductor device as claimed in claim 1, wherein said substrate is a metal substrate.

6. A semiconductor device as claimed in claim 1, wherein said contact comprise an ohmic contact and a Schottky contact.

7. A semiconductor device comprising:
   a diamond substrate;
   a non-doped diamond thin film formed on said substrate;
   a diamond active layer formed on the non-doped diamond thin film; and
   contacts formed on said diamond active layer;
   wherein said non-doped diamond thin film substantially reduces the influence of at least one of interface states and surface impurities upon the active layer, and wherein said non-doped diamond thin film insulates said active layer from said substrate.

* * * * *